(12) United States Patent
Hou

(10) Patent No.: US 10,707,440 B2
(45) Date of Patent: Jul. 7, 2020

(54) DISPLAY PANEL WITH AN ELASTIC COMPONENT SURROUNDING BY A FRAME SEALANT

(71) Applicant: BOE TECHNOLOGY GROUP CO., LTD., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/089,727

(22) PCT Filed: Jan. 26, 2018

(86) PCT No.: PCT/CN2018/074347
§ 371 (c)(1),
(2) Date: Sep. 28, 2018

(87) PCT Pub. No.: WO2018/205690
PCT Pub. Date: Nov. 15, 2018

(65) Prior Publication Data
US 2019/0207153 A1    Jul. 4, 2019

(30) Foreign Application Priority Data
May 11, 2017   (CN) .......................... 2017 1 0329212

(51) Int. Cl.
H01L 29/08 (2006.01)
H01L 33/00 (2010.01)
(Continued)

(52) U.S. Cl.
CPC ........ H01L 51/5246 (2013.01); B01J 20/041 (2013.01); B01J 20/046 (2013.01);
(Continued)

(58) Field of Classification Search
CPC . H01L 51/5256; H01L 27/3262; H01L 51/56; H01L 51/5253; H01L 51/5246
See application file for complete search history.

(56) References Cited

U.S. PATENT DOCUMENTS

2011/0132449 A1* 6/2011 Ramadas ............... H05B 33/04
136/256
2014/0307407 A1* 10/2014 Han ...................... G02F 1/1339
361/784
(Continued)

FOREIGN PATENT DOCUMENTS

CN    101363987    2/2009
CN    101847650    9/2010
(Continued)

OTHER PUBLICATIONS

International Searching Authority, "International Search Report," issued in connection with International Application No. PCT/CN2018/076347, dated May 3, 2018 9 pages.
(Continued)

Primary Examiner — Alonzo Chambliss
(74) Attorney, Agent, or Firm — Arent Fox LLP; Michael Fainberg

(57) ABSTRACT

The disclosure discloses a display panel, a method for fabricating the same and a display device. The display panel includes: a base substrate and a cover plate arranged opposite to each other, an organic light emitting display arranged between the base substrate and the cover plate, a frame sealant arranged between the base substrate and the cover plate and located around the organic light emitting display, and a filler arranged in a sealing space constituted by the base substrate, the cover plate and the frame sealant. The display panel further comprises: an elastic component arranged between the frame sealant and the organic light emitting display.

11 Claims, 7 Drawing Sheets

(51) Int. Cl.

| | |
|---|---|
| *H01L 31/0203* | (2014.01) |
| *H01L 21/00* | (2006.01) |
| *H01L 51/40* | (2006.01) |
| *H01L 51/52* | (2006.01) |
| *H01L 27/32* | (2006.01) |
| *B01J 20/04* | (2006.01) |
| *H01L 51/56* | (2006.01) |

(52) U.S. Cl.
CPC ...... *H01L 27/3244* (2013.01); *H01L 51/5259* (2013.01); *H01L 51/56* (2013.01); *H01L 27/32* (2013.01); *H01L 2251/303* (2013.01)

(56) References Cited

U.S. PATENT DOCUMENTS

| | | | |
|---|---|---|---|
| 2014/0319998 A1 | 10/2014 | Han | |
| 2015/0282336 A1* | 10/2015 | Jung | B32B 15/043 361/679.01 |
| 2016/0013440 A1 | 1/2016 | Luo et al. | |
| 2016/0254480 A1* | 9/2016 | Yang | H01L 51/5246 257/40 |
| 2016/0343977 A1 | 11/2016 | Zeng et al. | |
| 2017/0279076 A1 | 9/2017 | Song | |

FOREIGN PATENT DOCUMENTS

| | | |
|---|---|---|
| CN | 202443223 | 9/2012 |
| CN | 103472629 | 12/2013 |
| CN | 104124390 | 10/2014 |
| CN | 104241547 | 12/2014 |
| CN | 104505466 | 4/2015 |
| CN | 105093632 | 11/2015 |
| CN | 105097885 | 11/2015 |
| CN | 105607352 | 5/2016 |
| CN | 105609660 | 5/2016 |
| CN | 106549116 | 3/2017 |
| CN | 107068907 | 8/2017 |
| JP | 2001221986 | 8/2001 |
| JP | 2003100449 | 4/2003 |
| JP | 2011204364 | 10/2011 |
| JP | 2013012426 | 1/2013 |

OTHER PUBLICATIONS

State Intellectual Property Office of People's Republic of China, "Notification of the First Office Action," issued in connection with Chinese Patent Application No. 201710329212.8, dated Apr. 3, 2018 12 pages.

State Intellectual Property Office of People's Republic of China, "Notification of the Second Office Action," issued in connection with Chinese Patent Application No. 201710329212.8, dated Oct. 9, 2018 10 pages.

State Intellectual Property Office of People's Republic of China, "Third Office Action," issued in connection with Chinese Patent Application No. 201710329212.8, dated Apr. 30, 2019, 18 pages.

* cited by examiner

DISPLAY PANEL WITH AN ELASTIC COMPONENT SURROUNDING BY A FRAME SEALANT

This application is a National Stage of International Application No. PCT/CN2018/074347, filed Jan. 26, 2018, which claims priority to Chinese Patent Application No. 201710329212.8, filed May 11, 2017, both of which are hereby incorporated by reference in their entireties.

TECHNICAL FIELD

The disclosure relates to the field of display technologies and particularly to a display panel, a method for fabricating the same and a display device.

BACKGROUND

Compared with a Liquid Crystal Display (LCD), an Organic Light Emitting Display (OLED) has advantages such as self-illuminating, fast response, wide angle of view, high brightness, vivid color, light weight and the like, and is considered as a next generation display technology.

However, the organic materials and the metal materials in an OLED display panel are highly sensitive to the water oxygen and are easy to be oxidized and denatured, to thereby cause defects such as dark dots, pixel contraction, reduced lifetime and the like. Thus the OLED display panel requires a higher demand on the encapsulation.

SUMMARY

Embodiments of the disclosure provide a display panel, includes: a cover plate, a base substrate arranged opposite to the cover plate, an organic light emitting display arranged between the base substrate and the cover plate, a frame sealant arranged between the base substrate and the cover plate and located around the organic light emitting display, a filler arranged in a sealing space constituted by the base substrate, the cover plate and the frame sealant, and an elastic component arranged between the frame sealant and the organic light emitting display.

In a possible implementation, in the display panel above according to the embodiments of the disclosure, the elastic component contacts with the base substrate and the cover plate.

In a possible implementation, in the display panel above according to the embodiments of the disclosure, the elastic component is arranged around the organic light emitting display.

In a possible implementation, in the display panel above according to the embodiments of the disclosure, the elastic component is arranged at intervals around the organic light emitting display.

In a possible implementation, in the display panel above according to the embodiments of the disclosure, a gap is arranged between the frame sealant and the elastic component.

In a possible implementation, in the display panel above according to the embodiments of the disclosure, an absorbent compound is included in the gap.

In a possible implementation, in the display panel above according to the embodiments of the disclosure, the elastic component contacts with the frame sealant.

In a possible implementation, in the display panel above according to the embodiments of the disclosure, the elastic component includes the absorbent compound.

In a possible implementation, in the display panel above according to the embodiments of the disclosure, the display panel further includes: an encapsulation layer arranged between the organic light emitting display and the cover plate and completely covering the organic light emitting display.

In a possible implementation, in the display panel above according to the embodiments of the disclosure, the material of the elastic component includes any one or more of a rubber, an ABS resin or a polysiloxane.

In a possible implementation, in the display panel above according to the embodiments of the disclosure, the absorbent compound includes any one or more of a calcium oxide, a sodium oxide, a barium oxide, a magnesium oxide, a lithium oxide or a lithium bromide.

Accordingly, embodiments of the disclosure further provide a display device, which includes any one of the display panel above according to the embodiments of the disclosure.

In another aspect, embodiments of the disclosure further provide a method for fabricating the display panel, which includes: providing a base substrate on which an organic light emitting display is formed; providing a cover plate, fabricating a frame sealant at a position of a frame of the cover plate, and forming an elastic component at an inner side of the frame sealant; filling an area surrounded by the elastic component with the filler; fitting the base substrate with the cover plate in the vacuum environment, and curing the frame sealant and the filler via the ultraviolet light or heating.

In a possible implementation, in the method above according to the embodiments of the disclosure, after forming the elastic component and before filling the area surrounded by the elastic component with the filler, the method further includes: forming an absorbent compound between the elastic component and the frame sealant.

In a possible implementation, in the method above according to the embodiments of the disclosure, when forming the elastic component, the method further includes: mixing the absorbent compound in an elastic material for forming the elastic component.

DETAILED DESCRIPTION OF THE EMBODIMENTS

In order to make the objects, technical solutions, and advantages of the embodiments of the disclosure more apparent, the technical solutions according to the embodiments of the disclosure will be described below clearly and fully with reference to the drawings in the embodiments of the disclosure, and apparently the embodiments described below are only a part but not all of the embodiments of the disclosure. Based upon the embodiments here of the disclosure, all the other embodiments which can occur to those skilled in the art without any inventive effort shall fall into the scope of the disclosure.

Figure 1:
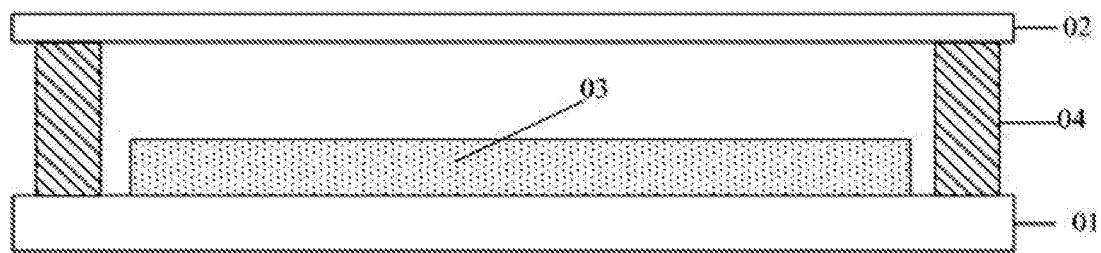
FIG. 1 is a schematic structural diagram of a display panel.

According to the technology known by the inventor, as illustrated in FIG. 1, an OLED display panel includes: a base substrate 01, a cover plate 02, an organic light emitting display 03 arranged between the base substrate 01 and the cover plate 02, and a frame sealant 04 arranged between the base substrate 01 and the cover plate 02, where the frame sealant 04 is used for sealing the organic light emitting display 03. When the sealed display panel is filled with the filler, cracks may be generated at the edge(s) of the cured frame sealant 04 due to the pressure effect, to thereby cause an increased water oxygen transmittance and influence the reliability of the OLED display panel.

The embodiments of the disclosure provide a display panel, a method for fabricating the same and a display device, so as to reduce the pressure applied on the frame sealant and increase the airtightness of the display panel.

The implementations of the display panel, the method for fabricating the same and the display device according to the embodiments of the disclosure will be illustrated below in details with reference to the accompanying drawings.

The thicknesses and shapes of respective film layers in the accompanying drawings do not reflect the actual proportions, and are merely intended to illustrate the content of the embodiments of the disclosure.

Figure 2:
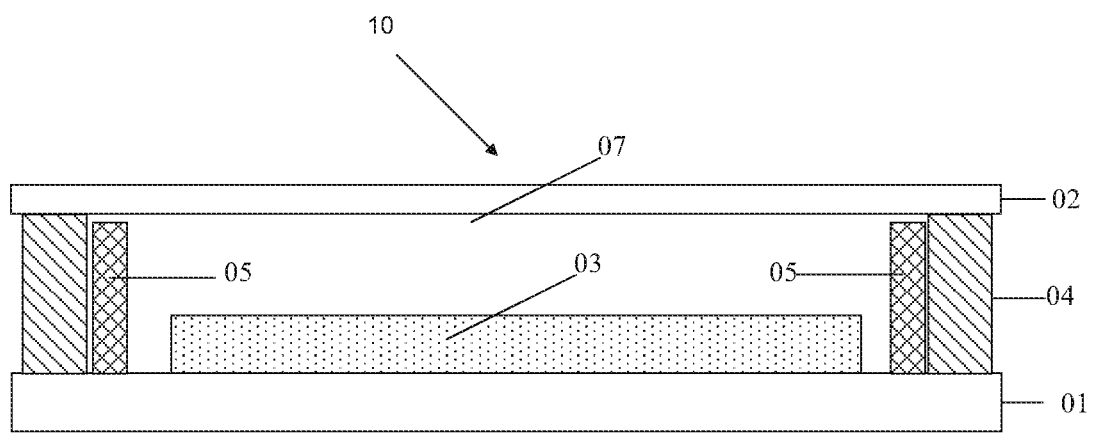
FIG. 2 is a schematic structural diagram of a display panel according to embodiments of the disclosure.

As illustrated in FIG. 2, the embodiments of the disclosure provide a display panel 10, which includes: a base substrate 01 and a cover plate 02 arranged opposite to each other, an organic light emitting display 03 arranged between the base substrate 01 and the cover plate 02, a frame sealant 04 arranged between the base substrate 01 and the cover plate 02 and located around the organic light emitting display 03, and filler 07 arranged in a sealing space constituted by the base substrate 01, the cover plate 02 and the frame sealant 04; where the display panel 10 further includes an elastic component 05 arranged between the frame sealant 04 and the organic light emitting display 03.

Particularly, the main effect of the elastic component 05 in the embodiments of the disclosure is to buffer the pressure of the filler on the frame sealant 04, so the elastic component 05 in the embodiments of the disclosure can be arranged continuously around an inner side of the frame sealant 04 in one or more rounds or arranged at intervals at an inner side of the frame sealant 04, which is not limited herein. Furthermore, the elastic component 05 according to the embodiments of the disclosure fits closely onto the frame sealant 04 or has a fixed distance from the frame sealant 04, which is not limited herein. The structure of the display panel 10 illustrated in FIG. 2 is only an optional implementation, and does not represent that the display panel only has the structure illustrated in FIG. 2.

With the display panel according to the embodiments of the disclosure, when the sealing area surrounded by the frame sealant 04 is filled with the filler 07, due to the elastic component 05 arranged between the frame sealant 04 and the organic light emitting display 03 and the elastic effect of the elastic component 05, the pressure of the filler 07 is buffered, the pressure applied on the frame sealant 04 is reduced, the crack problem caused by the frame sealant 04 is avoided, and the airtightness of the display panel 10 is further increased.

Figure 3:
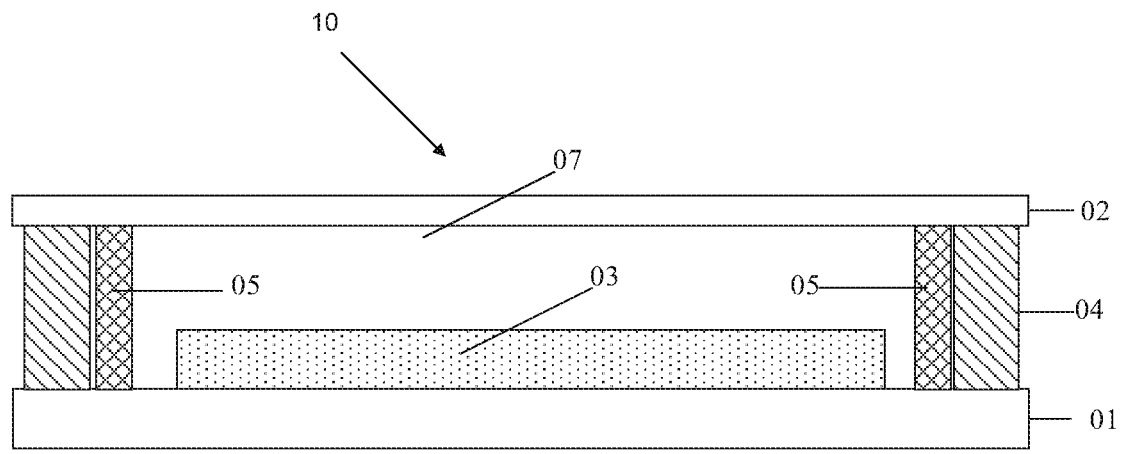
FIG. 3 is a schematic structural diagram of a display panel according to the embodiments of the disclosure.

Optionally, in the display panel above according to the embodiments of the disclosure, as illustrated in FIG. 3, the elastic component 05 contacts with the base substrate 01, and at the same time, the elastic component 05 contacts with the cover plate 02. Particularly the elastic component 05 is arranged between the base substrate 01 and the cover plate 02, and as illustrated in FIG. 2, a height of the elastic component 05 is set to be smaller than a height of the frame sealant 04. Or, as illustrated in FIG. 3, the height of the elastic component 05 is set to be the same as the height of the frame sealant 04. When the elastic component 05 is subjected to the pressure of the filler 07, the pressure can be buffered to a larger extent, to reduce the pressure applied on the frame sealant 04.

Figure 4:
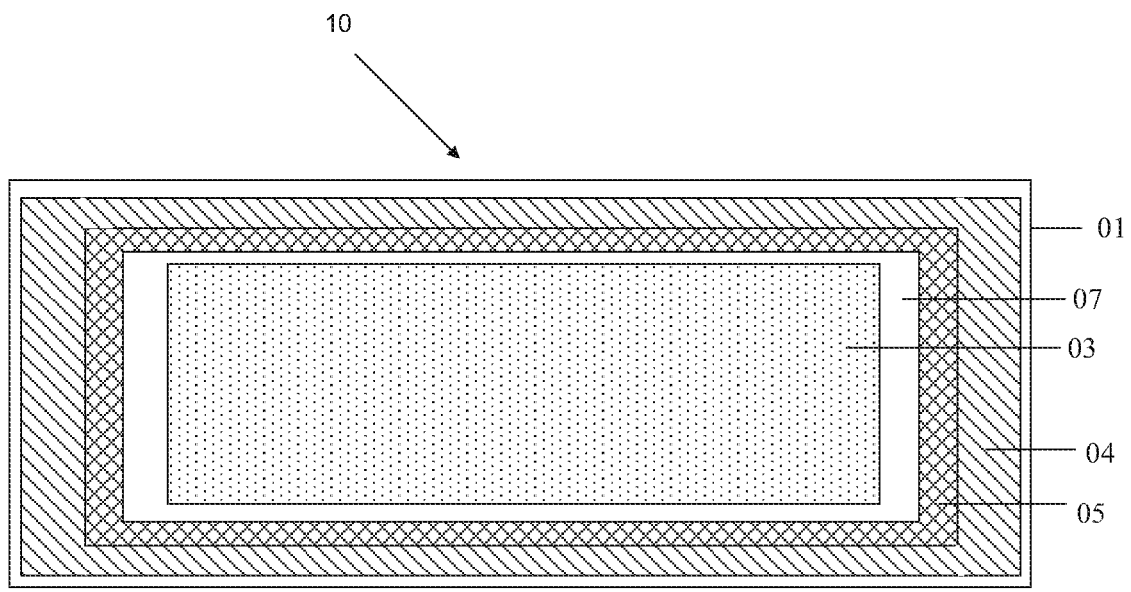
FIG. 4 is a schematic structural diagram of a display panel according to the embodiments of the disclosure.

Optionally, in the display panel above according to the embodiments of the disclosure, as illustrated in FIG. 4 which is a top view of the display panel 10, the organic light emitting display 03 of the display panel 10 is arranged at a display area of the display panel 10; and a non-display area is provided with the frame sealant 04 around the organic light emitting display 03, and the elastic component 05 arranged between the frame sealant 04 and the organic light emitting display 03, where the elastic component 05 is arranged around the organic light emitting display 03.

Particularly, as illustrated in FIG. 4, the elastic component 05 is arranged around the organic light emitting display 03 to form a continuous round, for example, a shape thereof is the same as a shape of the frame sealant 04, which surrounds the organic light emitting display 03 to form a closed round. It shall be noted that the elastic component 05 according to the embodiments of the disclosure can further be arranged to be multiple continuous rounds around the organic light emitting display 03, to thereby further reduce the pressure applied on the frame sealant 04. Or, as illustrated in FIG. 5, the elastic component 05 can also be arranged at intervals around the organic light emitting display 03, that is, the elastic component 05 is discontinuous.

Figure 5:
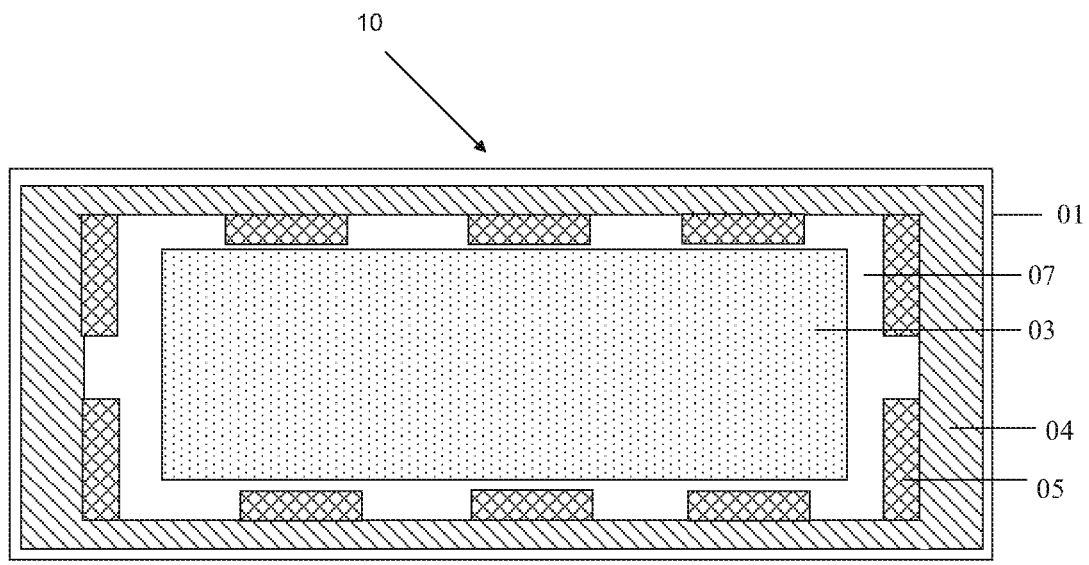
FIG. 5 is a schematic structural diagram of a display panel according to the embodiments of the disclosure.

As illustrated in FIG. 4 or FIG. 5, when the elastic component 05 is arranged around the organic light emitting display 03, the elastic component 05 contacts with both the base substrate 01 and the cover plate 02, or contacts with only the base substrate 01, which is not limited herein. When the elastic component 05 contacts with both the base substrate 01 and the cover plate 02, the sealing space can be formed among the elastic component 05, the base substrate 01 and the cover plate 02, and the sealing space is filled with the filler 07. Due to the extrusion of the filler 07, the elastic component 05 is subjected to the pressure of the extrusion to an extreme, to thereby reduce the pressure applied on the frame sealant 04 to the utmost extent.

Figure 6:
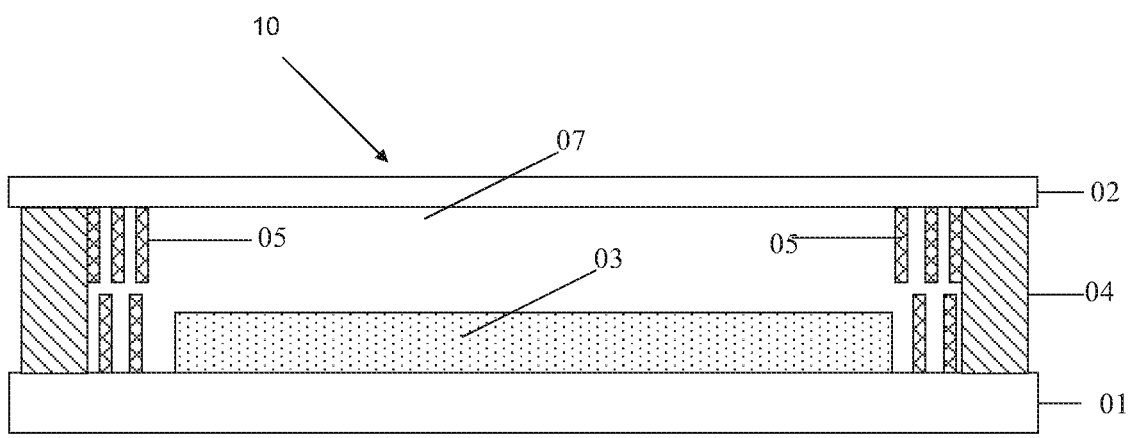
FIG. 6 is a schematic structural diagram of a display panel according to the embodiments of the disclosure.

Optionally, as illustrated in FIG. 6, when the elastic component 05 is arranged at intervals around the organic light emitting display 03, elastic components 05 can be arranged at intervals on the base substrate 01, and at the same time, a lower surface of the cover plate 02 can also include elastic components 05 arranged at intervals, and the elastic components 05 on the base substrate 01 and the elastic components 05 of the lower surface of the cover plate 02 are arranged in a staggered manner. That is, the elastic components 05 arranged on the base substrate 01 and the elastic components 05 arranged at the lower surface of the cover plate 02 are spaced apart from each other, to thereby play a buffer role and reduce the pressure applied on the frame sealant 04. FIG. 6 only illustrates an arrangement of the elastic components 05, but the elastic components are not limited to the arranging in a direction as illustrated in FIG. 6. For example, elastic components 05 between the base substrate 01 and the cover plate 02 are arranged at intervals respectively, and the elastic components 05 on the base substrate 01 can correspond to the elastic components 05 of the lower surface of the cover plate 02 in a one-to-one manner, that is, the staggered arrangement manner is not presented. It shall be noted that, as illustrated in FIG. 6, orthographic projections of the elastic components 05 arranged on the base substrate 01 onto a plane perpendicular to the cross section in FIG. 6 and orthographic projections of the elastic components 05 arranged at the lower surface of the cover plate 02 onto the plane perpendicular to the cross section in FIG. 6 have no overlapping area, but in a practical application, there can be the case that their orthographic projections may have the overlapping area, which can further play a role of buffering.

Figure 7:
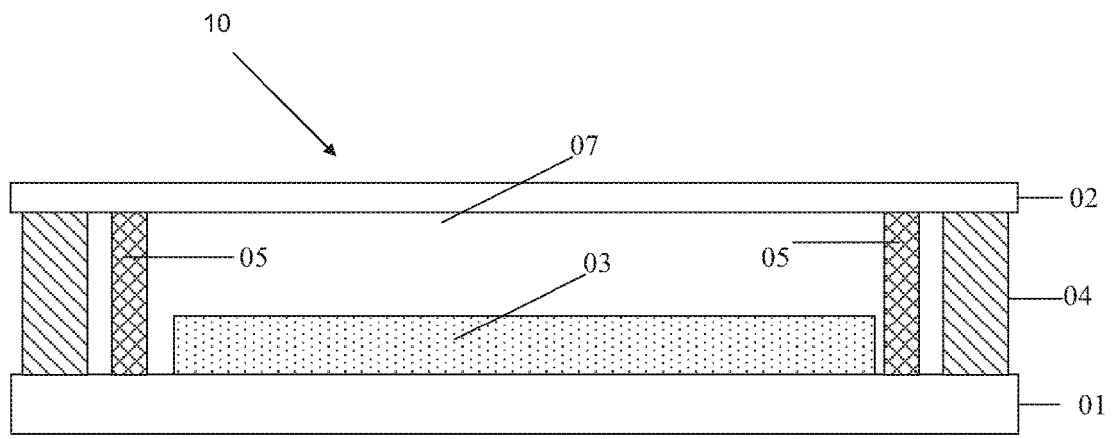
FIG. 7 is a schematic structural diagram of a display panel according to the embodiments of the disclosure.

Optionally, in order to further reduce the influence caused by the deformation generated when the elastic component 05 is subjected to the pressure on the frame sealant 04, in the display panel above 10 according to the embodiments of the disclosure, as illustrated in FIG. 7, there is a gap between the frame sealant 04 and the elastic component 05. Particularly, when the sealing space formed among the base substrate 1, the cover plate 02 and the frame sealant 04 is filled with the filler 07, due to the effect of the elastic component 05 which plays a buffer role, the pressure caused by the extrusion of the filler 07 is applied on the elastic component 05, and the deformation of the elastic component 05 will occur. Since the gap is arranged between the elastic component 05 and the frame sealant 04, the deformation of the elastic component 05 will not influence the frame sealant 04, to further avoid the problem that the deformation of the frame sealant 04 causes the cracks.

Figure 8:
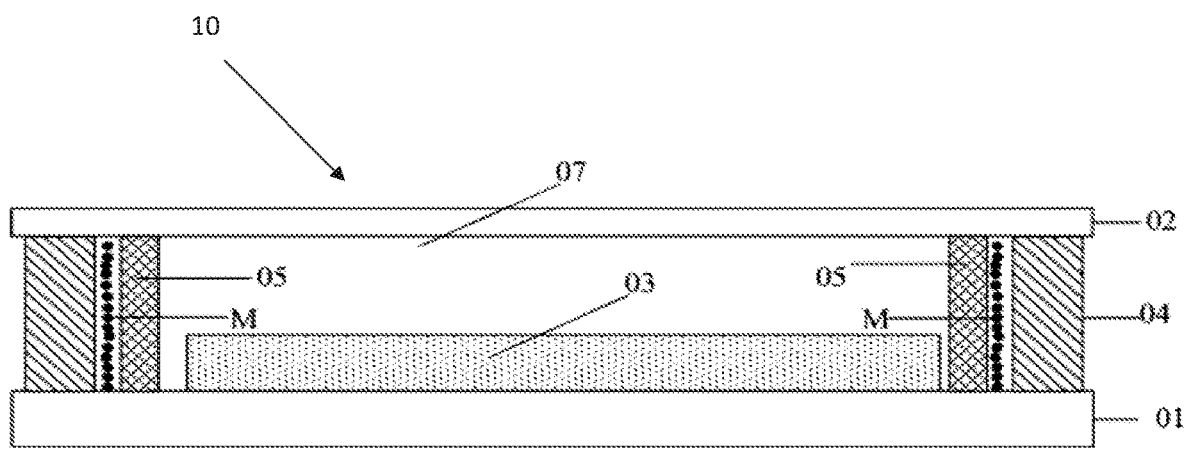
FIG. 8 is a schematic structural diagram of a display panel according to the embodiments of the disclosure.

Optionally, since the organic light emitting display 03 is easily to be oxidized and denatured by the water oxygen, in order to avoid the organic light emitting display 03 from being oxidized, in the display panel above 10 according to the embodiments of the disclosure, as illustrated in FIG. 8, an absorbent compound M is included in the gap. Here, the absorbent compound M can absorb the water vapor, to avoid the external water vapor from entering the organic light emitting display 03 when the display panel 10 is being filled or after the filling of the display panel 10. In the embodiments of the disclosure, after the absorbent compound M is arranged in the gap between the frame sealant 04 and the elastic component 05 and after the absorbent compound M reacts with the penetrated water, the volume of the absorbent compound M will increase. Since the absorbent compound M is not arranged inside the frame sealant 04, that is, the absorbent compound M and the frame sealant 04 are independent components, the absorbent compound M with an increased volume will only extrudes the elastic component 05 to make the elastic component 05 deform, and will not influence the shape of the frame sealant 04 to thereby protect the frame sealant 04. Where the absorbent compound M can be formed by coating or filled in the gap by filling.

Optionally, the absorbent compound NI can be provided in the gap between the frame sealant 04 and the elastic component 05, or can be provided inside the elastic component 05, or can be provided both in the gap between the frame sealant 04 and the elastic component 05 and inside the elastic component 05. Since the absorbent compound M is arranged in order to absorb the water vapor, any kind of arrangement is feasible.

Figure 9:
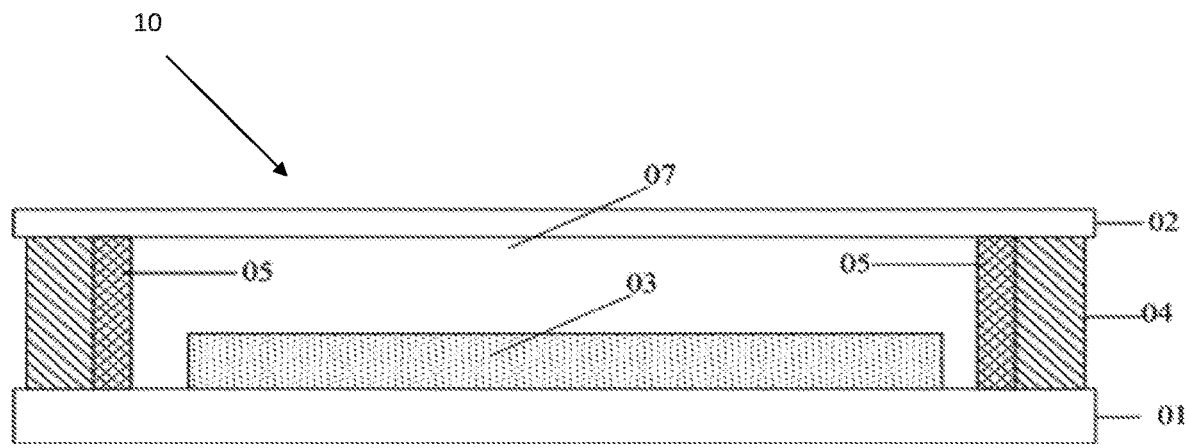
FIG. 9 is a schematic structural diagram of a display panel according to the embodiments of the disclosure.

Optionally, in the display panel above 10 according to the embodiments of the disclosure, as illustrated in FIG. 9, the elastic component 05 can contact with the frame sealant 04. Particularly, the elastic component 05 can fit closely onto the frame sealant 04.

Figure 10A:
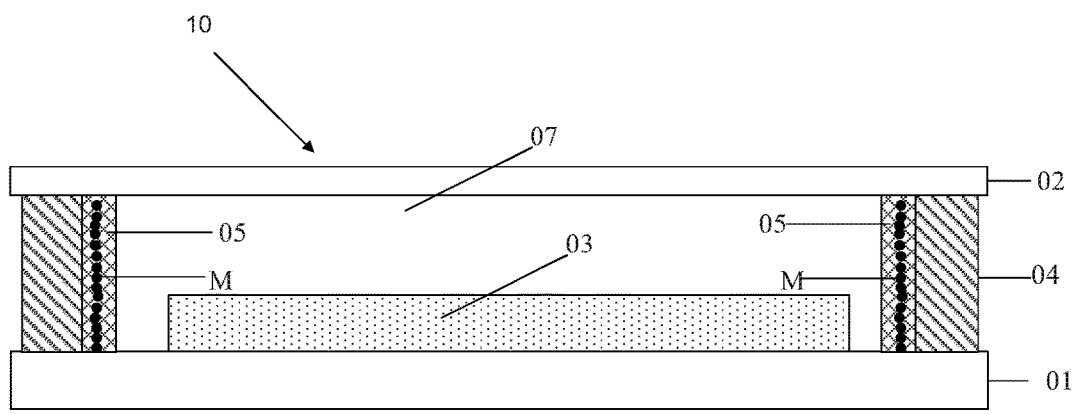
FIG. 10A and FIG. 10B are schematic structural diagrams of a display panel according to the embodiments of the disclosure respectively.
Figure 10B:
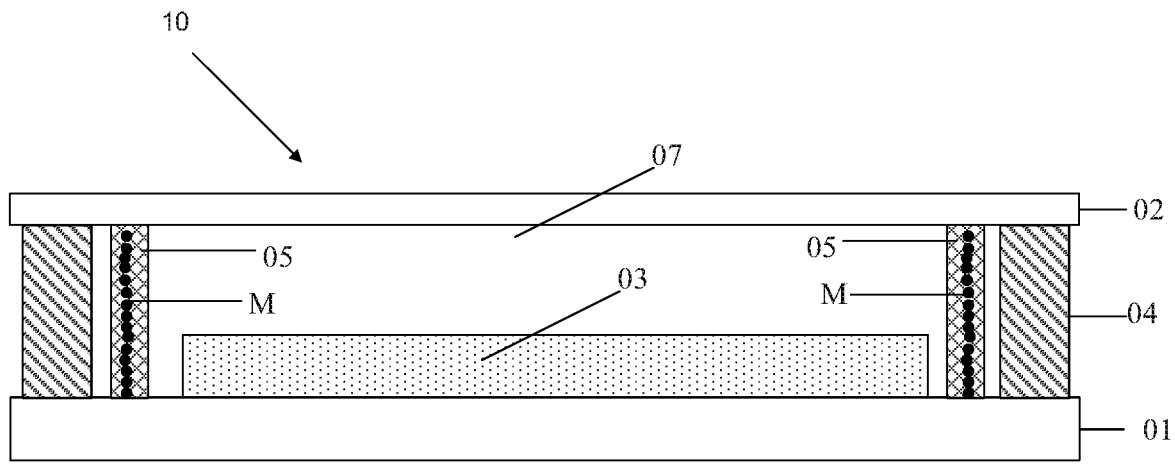

Optionally, in the display panel above 10 according to the embodiments of the disclosure, as illustrated in FIG. 10A, the elastic component 05 can include the absorbent compound M when there is no gap between the elastic component 05 and the frame sealant 04. Or, as illustrated in FIG. 10B, when there is the gap between the elastic component 05 and the frame sealant 04, the elastic component 05 can also include the absorbent compound M; and the gap between the elastic component 05 and the frame sealant 04 can also include the absorbent compound M. By arranging the absorbent compound M in the elastic component 05, the penetrated water vapor reacts with the absorbent compound M, to thereby reduce the permeability of the water vapor and avoid the problem that the organic light emitting display 03 is oxidized. Here, when the absorbent compound M is included in the elastic component 05, the absorbent compound M can be doped in the elastic material.

Figure 11:
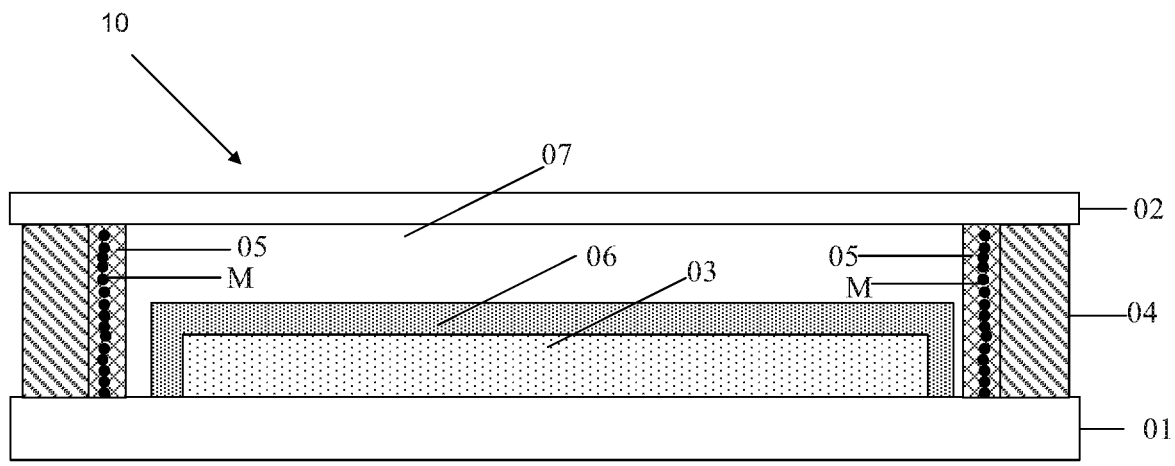
FIG. 11 is a schematic structural diagram of a display panel according to the embodiments of the disclosure.

Optionally, in the display panel above according to the embodiments of the disclosure, as illustrated in FIG. 11, the display panel 10 further includes: an encapsulation layer 06 arranged between the organic light emitting display 03 and the cover plate 02 and completely covering the organic light emitting display. The encapsulation layer 06 is used for encapsulating the organic light emitting display 03, and the encapsulation layer 06 includes: a first inorganic film layer, a second inorganic film layer, and a film layer arranged between the first inorganic film layer and the second inorganic film layer and consists of a plurality of inorganic film layers and organic film layers which are superimposed on each other. For example, along a direction away from the organic light emitting display, the encapsulation layer 06 includes five film layers, such as the first inorganic film layer, a first organic film layer, a third inorganic film layer, a second organic film layer and a second inorganic film layer, which are arranged in that order sequentially. Or, along the direction away from the organic light emitting display, the encapsulation layer 06 includes three film layers, such as the first inorganic film layer, the first organic film layer and the second inorganic film layer, which are arranged in that order sequentially, which is not limited herein.

Optionally, in the display panel above according to the embodiments of the disclosure, a material of the elastic component 05 can be any one or more of a rubber, an ABS resin (acrylonitrile-butadiene-styrene copolymer, which is the terpolymer consists of the acrylonitrile, butadiene and styrene) or a polysiloxane.

Optionally, in the display panel above according to the embodiments of the disclosure, the absorbent compound M can be any one or more of a calcium oxide, a sodium oxide, a barium oxide, a magnesium oxide, a lithium oxide or a lithium bromide.

It shall be noted that, any features in the embodiments of the disclosure can be combined with each other to thereby form a new embodiment, and a detailed description thereof will be omitted herein.

In conclusion, in the embodiments of the disclosure, the elastic component 05 is arranged between the frame sealant 04 and the organic light emitting display 03, to thereby avoid the problem of the cracks caused by the pressure generated for the frame sealant 04 when the display panel is filled with the filler 07, and further ensure the airtightness of the display panel. Further, the absorbent compound M is added in the elastic component 05 and/or in the gap between the elastic component 05 and the frame sealant 04, to thereby reduce the permeability of the water oxygen and avoid the problem that the organic light emitting display 03 in the display panel is oxidized, thus improving the reliability of the display panel, and increasing the display lifetime of the display panel.

Based upon a same inventive concept, the embodiments of the disclosure further provide a method for fabricating the display panel, where the method includes following operations.

Providing a base substrate on which an organic light emitting display is formed. Where the formation of the light emitting display includes: forming an ITO on the base substrate and patterning the ITO as an anode of the OLED, via a patterning process; fabricating a hole injection layer, a hole transmission layer, a light emitting layer, an electron transmission layer, an electron injection layer and a cathode on the ITO sequentially.

Providing a cover plate, fabricating a frame sealant at a position of a frame of the cover plate, and forming an elastic component at an inner side of the frame sealant.

Filling an area surrounded by the elastic component with the filler.

Fitting the base substrate with the cover plate in a vacuum environment, and curing the frame sealant and the filler via an ultraviolet (UV) light or heating.

Optionally, in the method for fabricating the display panel according to the embodiments of the disclosure, after forming the elastic component and before filling the area surrounded by the elastic component with the filler, the method further includes: forming an absorbent compound between the elastic component and the frame sealant.

Optionally, in the method for fabricating the display panel according to the embodiments of the disclosure, when forming the elastic component, the method further includes: mixing the absorbent compound in an elastic material for forming the elastic component, so that the absorbent compound is included in a formed elastic component.

Therefore, in the display panel formed by the method for fabricating the display panel according to the embodiments of the disclosure, when the sealing area surrounded by the frame sealant is filled with the filler, due to the elastic component arranged between the frame sealant and the organic light emitting display and the elastic effect of the elastic component, the pressure of the filler is buffered, the pressure applied on the frame sealant is reduced, the crack problem caused by the frame sealant is avoided, and the airtightness of the display panel is further increased.

Figure 12:
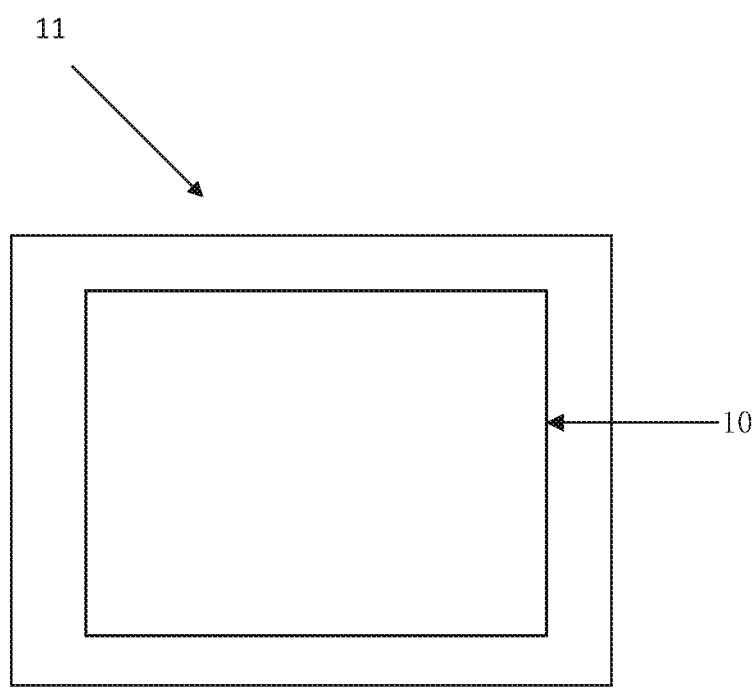
FIG. 12 is a schematic structural diagram of a display panel according to the embodiments of the disclosure.

Based upon a same inventive concept, the embodiments of the disclosure further provide a display device, and as illustrated in FIG. 12, the display device 11 includes any display panel 10 above according to the embodiments of the disclosure. And the embodiments and beneficial effects of the display device are the same as the embodiments of the display panel, so that a repeated description thereof will be omitted herein.

Evidently those skilled in the art can make various modifications and variations to the disclosure without departing from the spirit and scope of the disclosure. Thus the disclosure is also intended to encompass these modifications and variations to the disclosure as long as these modifications and variations come into the scope of the claims of the disclosure and their equivalents.

What is claimed is:

1. A display panel, wherein the display panel comprises:
   a cover plate;
   a base substrate arranged opposite to the cover plate;
   an organic light emitting display arranged between the base substrate and the cover plate;
   a frame sealant arranged between the base substrate and the cover plate and located around the organic light emitting display;
   a filler arranged in a sealing space constituted by the base substrate, the cover plate and the frame sealant; and
   an elastic component arranged between the frame sealant and the organic light emitting display;
   wherein a gap is arranged between the frame sealant and the elastic component; and
   an absorbent compound is comprised in the gap; and
   the elastic component comprises a plurality of first elastic components arranged at intervals on the base substrate and a plurality of second elastic components arranged at intervals on the cover plate; and the first elastic components and the second elastic components are arranged in a staggered manner.

2. The display panel according to claim 1, wherein the elastic component is arranged around the organic light emitting display.

3. The display panel according to claim 1, wherein the elastic component comprises an absorbent compound.

4. The display panel according to claim 1, wherein the display panel further comprises: an encapsulation layer arranged between the organic light emitting display and the cover plate and completely covering the organic light emitting display.

5. The display panel according to claim 1, wherein a material of the elastic component comprises any one or more of a rubber, an ABS resin or a polysiloxane.

6. The display panel according to claim 1, wherein the absorbent compound comprises any one or more of a calcium oxide, a sodium oxide, a barium oxide, a magnesium oxide, a lithium oxide or a lithium bromide.

7. A display device comprising a display panel, wherein the display panel comprises:
   a cover plate;
   a base substrate arranged opposite to the cover plate;
   an organic light emitting display arranged between the base substrate and the cover plate;
   a frame sealant arranged between the base substrate and the cover plate and located around the organic light emitting display;
   a filler arranged in a sealing space constituted by the base substrate, the cover plate and the frame sealant; and
   an elastic component arranged between the frame sealant and the organic light emitting display;
   wherein a gap is arranged between the frame sealant and the elastic component; and
   an absorbent compound is comprised in the gap; and
   the elastic component comprises a plurality of first elastic components arranged at intervals on the base substrate and a plurality of second elastic components arranged at intervals on the cover plate; and the first elastic components and the second elastic components are arranged in a staggered manner.

8. A method for fabricating the display panel according to claim 1, comprising:

providing a base substrate on which an organic light emitting display is formed;

providing a cover plate, fabricating a frame sealant at a position of a frame of the cover plate, and forming an elastic component at an inner side of the frame sealant;

forming an absorbent compound between the elastic component and the frame sealant;

filling an area surrounded by the elastic component with a filler;

fitting the base substrate with the cover plate in a vacuum environment, and curing the frame sealant and the filler via an ultraviolet light or heating.

9. The method according to claim 8, wherein when forming the elastic component, the method further comprises:

mixing an absorbent compound in an elastic material for forming the elastic component.

10. The display device according to claim 7, wherein the elastic component is arranged around the organic light emitting display.

11. The display device according to claim 7, wherein the elastic component comprises an absorbent compound.

* * * * *